(12) United States Patent
Loglisci

(10) Patent No.: US 12,385,950 B2
(45) Date of Patent: Aug. 12, 2025

(54) MAGNETIC CURRENT SENSOR, HYBRID CURRENT SENSOR COMPRISING SUCH A MAGNETIC CURRENT SENSOR, AND CIRCUIT BREAKER COMPRISING SUCH A HYBRID CURRENT SENSOR

(71) Applicant: Schneider Electric Industries SAS, Rueil Malmaison (FR)

(72) Inventor: David Loglisci, Vaulnaveys le Haut (FR)

(73) Assignee: Schneider Electric SAS, Rueil Malmaison (FR)

( * ) Notice: Subject to any disclaimer, the term of this patent is extended or adjusted under 35 U.S.C. 154(b) by 85 days.

(21) Appl. No.: 18/369,238

(22) Filed: Sep. 18, 2023

(65) Prior Publication Data
US 2024/0094263 A1    Mar. 21, 2024

(30) Foreign Application Priority Data
Sep. 20, 2022    (FR) ...................................... 2209497

(51) Int. Cl.
*G01R 15/18*    (2006.01)
*G01R 19/00*    (2006.01)
*H02H 3/08*    (2006.01)

(52) U.S. Cl.
CPC ....... *G01R 15/181* (2013.01); *G01R 19/0092* (2013.01); *H02H 3/08* (2013.01)

(58) Field of Classification Search
CPC .... G01R 15/207; G01R 15/18; G01R 15/181; G01R 19/0092; H01F 27/02; H01F 38/30; H02H 3/08

(Continued)

(56) References Cited

U.S. PATENT DOCUMENTS

2013/0314083 A1*  11/2013  Loglisci ................. G01R 19/00
                                                                29/832
2014/0132249 A1*  5/2014  Loglisci .................. H01F 27/29
                                                                324/144

(Continued)

FOREIGN PATENT DOCUMENTS

FR    2990759 A1    11/2013
FR    2998059 A1    5/2014
FR    3030763 A1    6/2016

OTHER PUBLICATIONS

French Search Report and Written Opinion dated May 8, 2023 for corresponding French Patent Application No. FR2209497, 10 Pages.

*Primary Examiner* — Kevin J Comber
(74) *Attorney, Agent, or Firm* — Troutman Pepper Locke LLP

(57) ABSTRACT

A magnetic current sensor includes a magnetic circuit, an electrical winding, an insulating coil, and two leads respectively mounted on terminal parts of the coil and connected to ends of the winding. Each lead includes a main body, received in complementary fashion in a recess of the coil, and elongate along a body axis transversal to a coil axis. Each lead also includes two tongues protruding from a lateral face of the main body, each running from an end joined to the main body up to a free end. At their joining end, the tongues extend along respective tongue axes, which are parallel and each extend transversely to the coil axis and to the body axis. Between their joining end and their free end, the tongues are folded against the same lateral wall of the recess so as to keep the lead in position.

14 Claims, 14 Drawing Sheets

(58) Field of Classification Search
USPC .......................................................... 361/93.1
See application file for complete search history.

(56) References Cited

U.S. PATENT DOCUMENTS

2016/0178661 A1* 6/2016 Olivier ................... B23K 26/21
 324/156
2019/0302151 A1* 10/2019 Manikandan ........ H02H 1/0007

* cited by examiner

MAGNETIC CURRENT SENSOR, HYBRID CURRENT SENSOR COMPRISING SUCH A MAGNETIC CURRENT SENSOR, AND CIRCUIT BREAKER COMPRISING SUCH A HYBRID CURRENT SENSOR

TECHNICAL FIELD

The present invention relates to a magnetic current sensor. It also relates to a hybrid current sensor, comprising such a magnetic current sensor. It also relates to a circuit breaker comprising such a hybrid current sensor.

BACKGROUND

Magnetic current sensors are current transformers allowing the provision, on the basis of a primary current, of a secondary supply current. These magnetic current sensors typically comprise a magnetic circuit, through which an electrical conductor forming the primary circuit passes, and an electrical winding, which is wound around a portion of the magnetic circuit and at the ends of which the secondary current is available. Such a magnetic current sensor can be used in particular in a hybrid current sensor where, in addition to passing through the magnetic circuit of the magnetic current sensor, the electrical conductor forming the primary circuit passes through a Rogowski coil, the ends of which are connected to an electronic circuit for acquiring and measuring the primary current, that is to say the electrical current flowing in the electrical conductor forming the primary circuit, this electronic circuit being supplied with power by the winding of the magnetic current sensor. Such hybrid current sensors are used in particular in high-power circuit breakers, opening of which is controlled by the aforementioned electronic circuit.

The invention more specifically concerns magnetic current sensors in which an insulating coil is interposed between the magnetic circuit, the aforementioned portion of which is received inside the coil, and the winding, which is wound on the coil. This coil bears two leads, which are respectively connected to the ends of the winding and which allow electrical elements to be connected in order to conduct the current provided by the winding to a load to be supplied with power, such as the aforementioned electronic circuit. In practice, the mounting of these leads on the coil must take account of significant constraints related to the various operations for assembling the magnetic current sensor, in particular the welding operations between the lead and, firstly, the ends of the winding and, secondly, the electrical elements connecting the lead to the load to be supplied with power. The result of this is that the leads are generally mounted on the coil simply by way of mechanical interference, typically by wedging/clipping.

The leads can be the cause of faults leading to interruption of the connection between the winding and the load to be supplied with power, the consequences of which can be particularly serious when the magnetic current sensor is integrated in a high-power circuit breaker. This is because, during operation, magnetic current sensors can be subject to operating temperatures and/or operating vibrations such that the leads are at risk of gradually detaching from the coil, until the wire of the winding breaks, and/or of cutting through a portion of the wire of the winding that is disposed across an edge of the leads. The attachment of the leads to the coil can be strengthened using glue or resin, which is applied so as to collectively coat each of the leads and the part of the coil where this lead is mounted. This solution is effective but does not provide complete satisfaction, in particular from an environmental and repeatability standpoint.

SUMMARY

The aim of the present invention is to propose an improved magnetic current sensor for which the mounting of the leads on the coil is robust, reliable and under control.

To this end, the subject of the invention is a magnetic current sensor, comprising:—a magnetic circuit that is designed to surround an electrical conductor forming a primary circuit for the magnetic circuit,
  an electrical winding, which includes two ends and also an extensive part that connects the two ends and that is wound around a portion of the magnetic circuit,
  an insulating coil, which defines a coil axis on which the coil is substantially centred, and which includes two terminal parts that are opposite one another along the coil axis, the coil being radially interposed between said portion of the magnetic circuit, which is received inside the coil, and the winding, which is wound coaxially on the coil, and
  two leads, which are respectively mounted on the terminal parts of the coil and which are respectively connected to the ends of the winding.

In this magnetic current sensor, each lead includes a main body that is:
  received in complementary fashion in a recess made in the corresponding terminal part of the coil,
  elongate along a body axis extending transversely to the coil axis, and
  provided with a first lateral face, which faces the coil axis, and with a second lateral face, which faces away from the coil axis.

Moreover, in this magnetic current sensor, each lead also includes two tongues that:
  protrude from the first lateral face of the main body, each running from an end joined to the main body up to a free end,
  are remote from one another along the body axis,
  at their end joined to the main body, extend from the first lateral face of the main body along respective tongue axes, which are parallel and each extend transversely to the coil axis and to the body axis, and
  between their end joined to the main body and their free end, are folded against the same lateral wall of the corresponding recess so as to keep the lead in position with respect to the coil.

One of the ideas on which the invention is based is to implement a totally mechanical solution to ensure that the leads are mounted on the coil, in particular without resorting to glue or similar chemical products, while taking account of the constraints for assembling the rest of the magnetic current sensor. To this end, the invention has provision for each lead to incorporate two tongues protruding from the main body of the lead, which tongues are folded against a lateral wall of the recess that the coil delimits in order to receive this main body, said folding being designed to lock the main body in position in the recess and therefore to hold the lead in place with respect to the coil. The folded shape of the tongues allows them to make the mounting of the lead on the coil robust and reliable, while preventing them from extending across the inside of the coil, where a portion of the magnetic circuit is received. In particular, the locked mounting of the lead on the coil withstands common operating conditions when the magnetic current sensor is used in a high-power circuit breaker by withstanding in particular temperatures in the order of 150° C. and vibrations under 8 g. The invention's solution thus proves particularly practical and effective, without requiring modification or adaptation of the magnetic circuit and the winding, and it is simple to implement, in particular by including in the operations for assembling the magnetic current sensor consistent with the invention an operation of folding the tongues and then, if necessary, an operation of cutting/levelling the tongues at their free end. Moreover, as explained in detail below, the main body of each lead can advantageously incorporate, other than the two tongues, arrangements that can be used to strengthen the attachment to the coil further and/or to make the electrical connection to the winding and to a track connecting the lead to a load effectively and/or to avoid continuing the lead into a region outside the recess where it risks cutting through the wire of the winding.

Thus, according to advantageous additional features of the magnetic current sensor according to the invention, taken in isolation or according to all technically possible combinations:

Each tongue is folded 95°±5° against the lateral wall of the corresponding recess.

The tongues of each lead are folded so as to abut the lateral wall of the corresponding recess in a direction parallel to the tongue axes in order to prevent the main body from coming out of the recess in this direction.

The tongues of each lead are folded so as to abut the lateral wall of the corresponding recess in directions that are parallel to the body axis and opposite one another, in order to immobilize the main body in the recess in these directions.

The first lateral face of the main body of each lead includes first bearing surfaces that are located on either side, along the body axis, of at least one of the two tongues of the lead, and pressed, in a direction parallel to the tongue axes, against an end wall of the corresponding recess.

Each tongue of each lead is, at its free end, substantially flush with the lateral wall of the corresponding recess.

The two leads are symmetrical to one another with respect to a geometric plane that is perpendicular to the coil axis, but without being interchangeable with one another.

The magnetic current sensor also comprises two electrical tracks that respectively connect the leads to a load so that the winding is able to supply power to this load.

Each lead moreover includes a leg that (i) extends at an angle from a first of the two longitudinal ends of the main body, the tongues of the lead and the leg all being bent towards the same lateral side of the main body, and (ii) is joined, in particular by welding, to the electrical track associated with the lead, in order to connect this electrical track to the lead.

Each lead does not continue, along the body axis, from the second longitudinal end of the main body to outside the corresponding recess.

Each lead moreover includes a mast that protrudes from the second lateral face of the main body, that is angled towards the second longitudinal end of the main body so as to extend along the second lateral face of the main body, and around which the end of the winding that is associated with the lead is joined, in particular by welding, in order to connect this end of the winding to the lead.

The second lateral face of the main body of each lead includes second bearing surfaces that are located on either side, along the body axis, of the mast, and suitable for, prior to the mast being bent, applying a tool thereto for inserting and/or holding the main body in place in the corresponding recess, in particular while the tongues are bent.

The invention also relates to a hybrid current sensor, comprising:

a magnetic current sensor as defined hereinabove, a current measuring device, comprising a Rogowski coil, the magnetic circuit of the magnetic current sensor and the Rogowski coil being designed to surround the same electrical conductor forming a primary circuit for each of them, and an electronic circuit, which is configured to detect and measure an electrical current in said electrical conductor on the basis of the current flowing in the Rogowski coil, the electronic circuit being supplied with power by the winding of the magnetic current sensor by being connected to the leads via electrical tracks.

The invention also relates to a circuit breaker, comprising one or more poles and also an insulating casing, which bears the pole or poles. The or each pole comprises:

two terminal pads, which are supported by the casing and which can be connected from the outside of the casing to an electrical circuit that is to be protected by the circuit breaker, two contact elements, which are disposed in an arc quenching chamber delimited inside the casing, and which are respectively connected to the terminal pads while being able to be moved with respect to one another between a closed position, in which the contact elements are in direct contact with one another, and an open position, in which the contact elements are separated from one another, a hybrid current sensor, which is as defined hereinabove and which is arranged inside the casing so that one of the two terminal pads is surrounded by both the magnetic circuit of the magnetic current sensor and the Rogowski coil of the current measuring device and thus forms a primary circuit for this magnetic circuit and for this Rogowski coil, and a mechanism, which is arranged inside the casing and which is suitable for moving the contact elements from the closed position to the open position when a malfunction is detected by the electronic circuit of the hybrid current sensor.

BRIEF DESCRIPTION OF THE DRAWINGS

The invention will be better understood on reading the description that follows, which is provided solely by way of example and written with reference to the drawings, in which.

DETAILED DESCRIPTION

Figure 1:
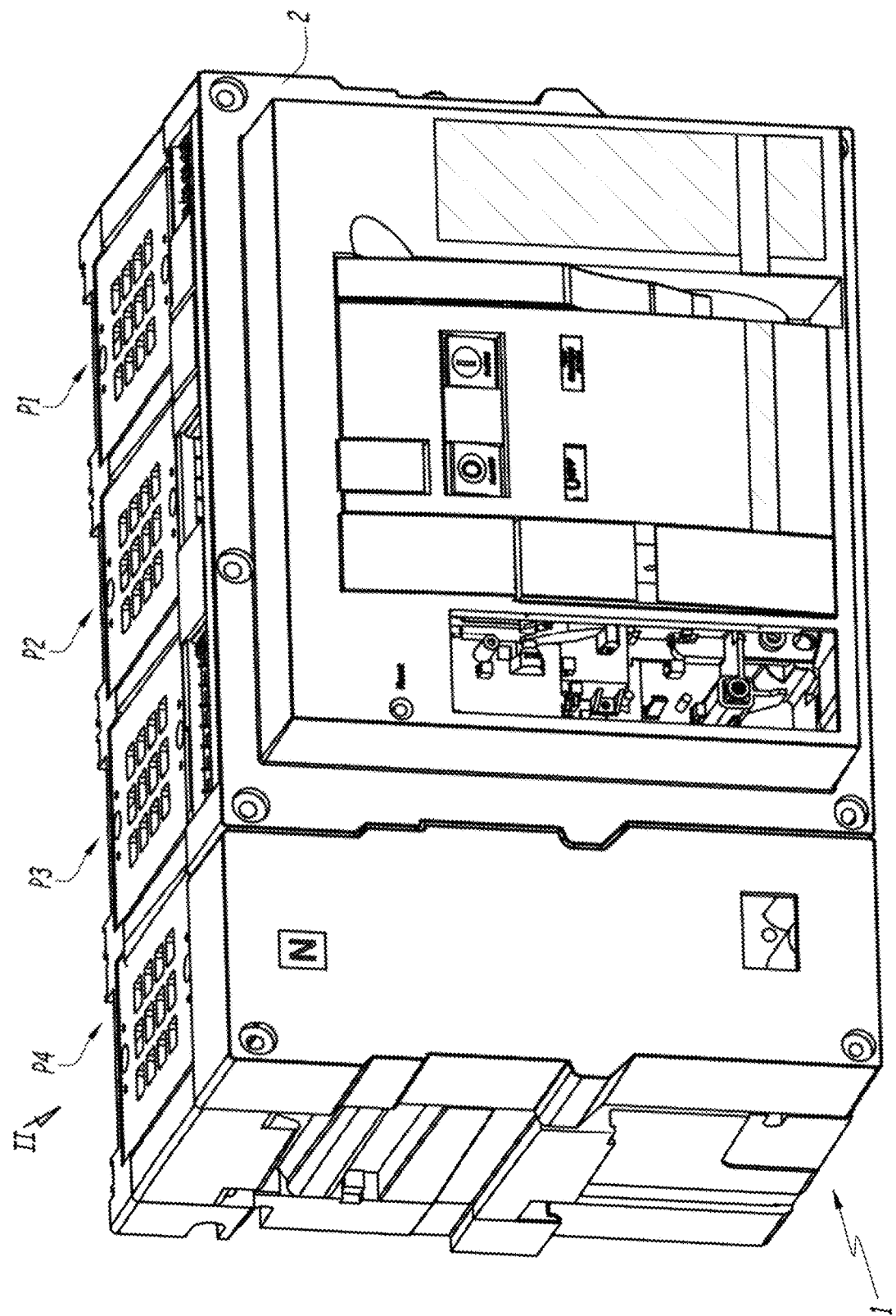
FIG. 1 is a perspective view of a circuit breaker consistent with the invention.
Figure 2:
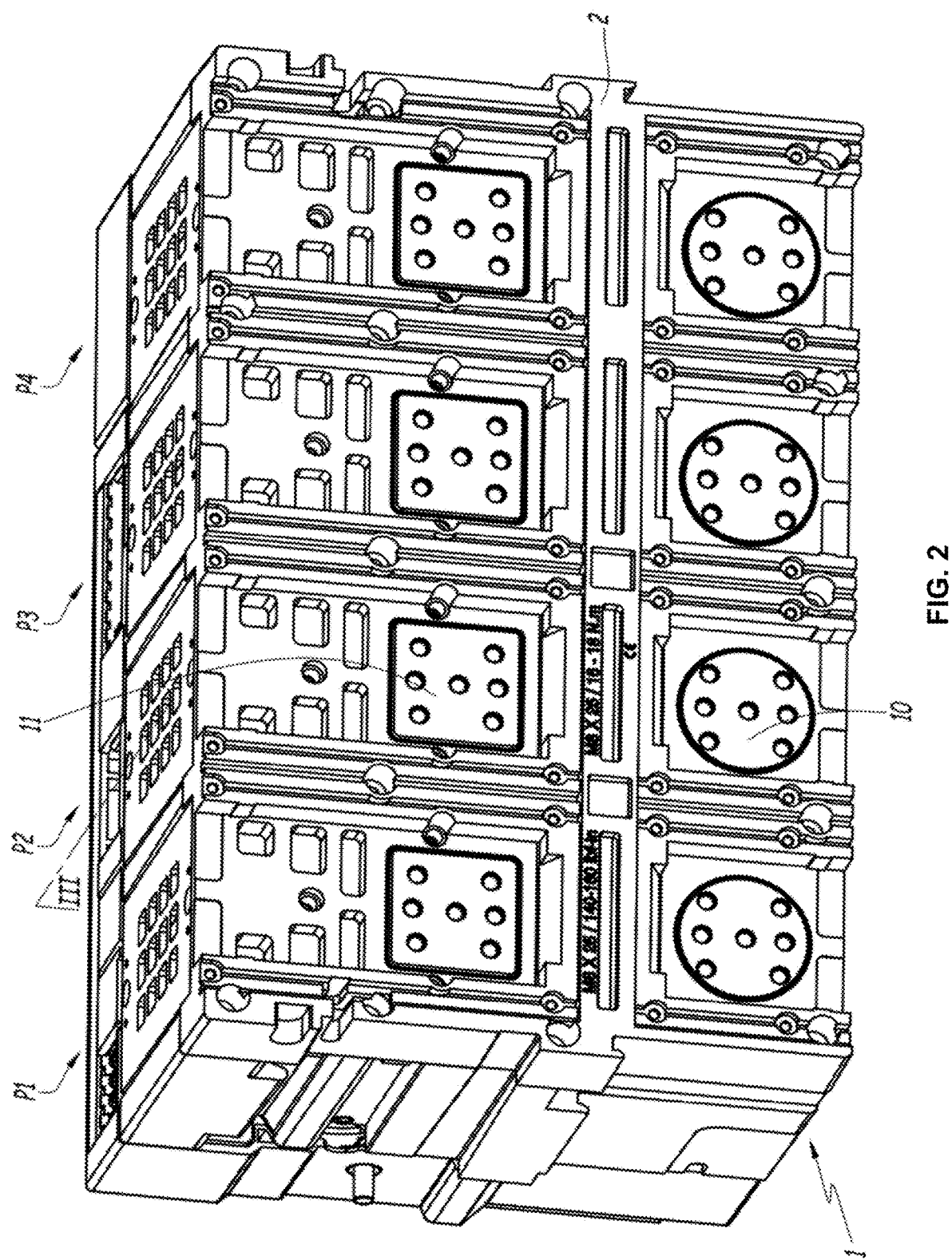
FIG. 2 is a perspective view along the arrow II in FIG. 1.
Figure 3:
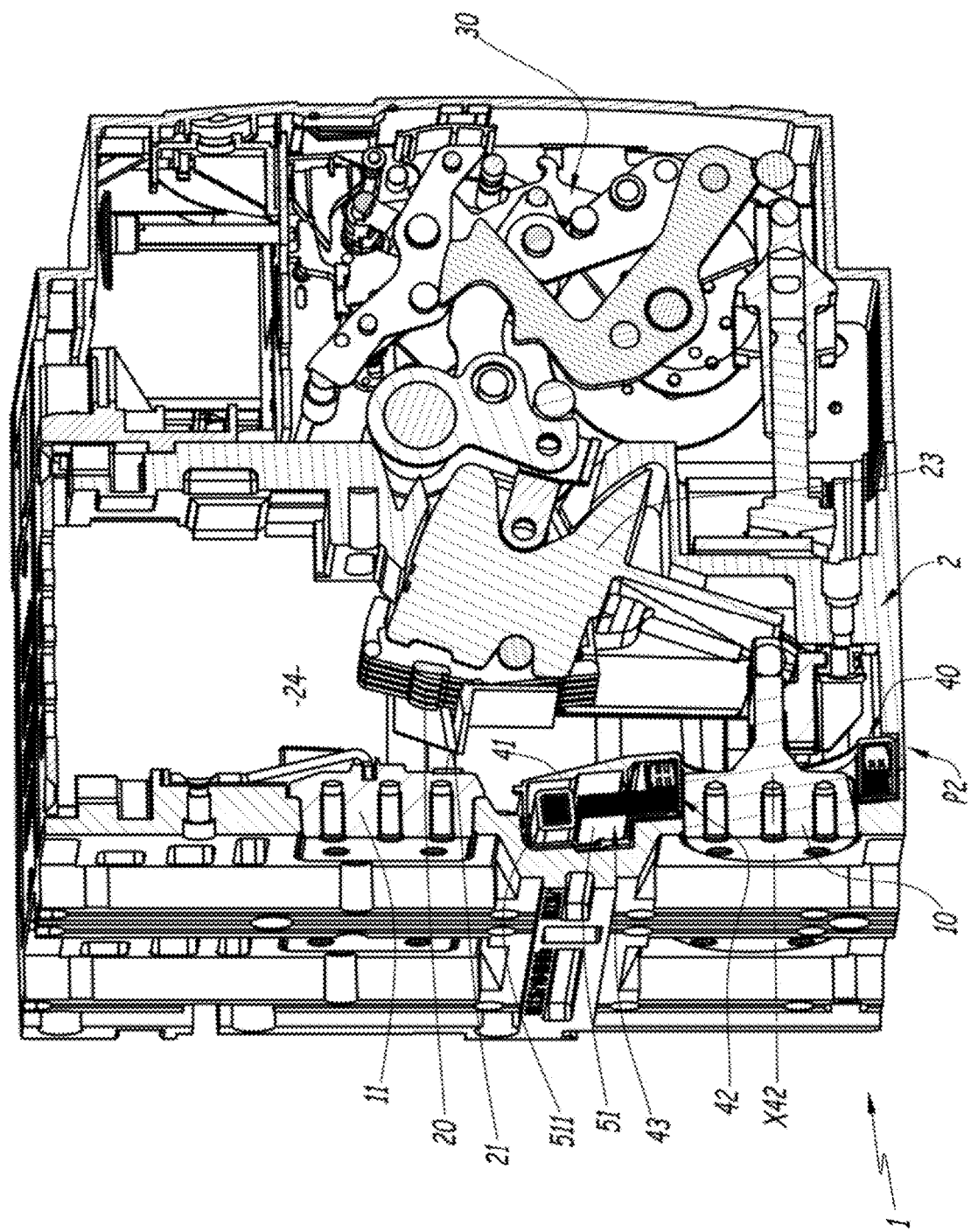
FIG. 3 is a section along the plane III in FIG. 2.

FIGS. 1 to 3 show an air circuit breaker 1 that can be used to protect electrical systems against abnormal conditions, such as overvoltages, short circuits or overcurrents. The circuit breaker 1 is typically a high-power circuit breaker, in particular a high-amperage circuit breaker in the sense that, in the normally-closed state of the circuit breaker 1, the circuit breaker 1 permits itself to carry a constant, DC or even AC, current, the level of which is between a few hundred and a few thousand amps, in particular between 500 A and 7500 A.

The circuit breaker 1 here is a multipolar circuit breaker, being intended to be used in an electrical circuit comprising multiple electrical poles. In the example shown in the figures, the circuit breaker 1 comprises four independent poles P1, P2, P3 and P4. A variant that is not shown is that the circuit breaker 1 comprises a different number of poles, for example 2 or 3. Another variant that is not shown is that the circuit breaker 1 comprises only a single pole.

The circuit breaker 1 comprises an insulating casing 2, which bears the poles P1 to P4. The casing 2 is made from a plastic material, for example. The casing 2 delimits an internal volume, which is essentially closed and which, here, is distributed over four separate compartments, which are respectively associated with the poles P1 to P4.

As each of the poles P1 to P4 is identical to the other poles, only one of them will be described below, namely the pole P2, which is shown in section in FIG. 3. The description provided for the pole P2 applies to each of the other poles P1, P3 and P4.

The pole P2 comprises two terminal pads 10 and 11 that can be used to connect the pole P2 to an electrical circuit that is to be protected by the circuit breaker 1. The terminal pads 10 and 11, which are made from an electrically conductive material, generally a metal such as copper, are supported by the casing 2 so as to be able to be electrically connected from the outside of the casing 2 to the electrical circuit to be protected. Here, the terminal pads 10 and 11 pass through a dedicated wall of the casing 2, emerging, on either side of this dedicated wall, outside the casing 2 and inside the casing 2, in other words in the internal volume of said casing, more precisely inside the compartment of this internal volume that is associated with the pole P2.

The pole P2 also comprises two contact elements 20 and 21 that are respectively connected to the terminal pads 10 and 11 while being able to be moved with respect to one another between a closed position, which is not shown, and an open position, which is shown in FIG. 3. In the closed position, the contact elements 20 and 21 are in direct contact with one another and allow an electric current to flow between the terminal pads 10 and 11. In their open position, the contact elements 20 and 21 are separated from one another and interrupt the electrical flow between the terminal pads 10 and 11.

In the embodiment under consideration in the figures, the contact element 20 is supported fixedly by a mobile leg 23 that is electrically connected to the terminal pad 10, while the contact element 21 is supported fixedly by the terminal pad 11, which is itself supported fixedly by the casing 2.

In every case, the contact elements 20 and 21 are disposed in an arc quenching chamber 24 associated with the pole P2. The arc quenching chamber 24 is delimited inside the casing 2, thus forming a part of the internal volume of said casing, more precisely a part of the compartment of this internal volume that is associated with the pole P2. The arc quenching chamber 24 is filled with air and surrounds the contact elements 20 and 21 so as to promote quenching of the electric arc that forms between the contact elements 20 and 21 when said contact elements change from their closed position to their open position. Between its being formed and its being quenched, the electric arc ionizes the air that is present in the arc quenching chamber 24, generating gases, referred to as switching gases, that are partially ionized and that contain particles in suspension, such as soot and/or metal particles. The formation of this electric arc creates an overpressure in the arc quenching chamber 24, which overpressure needs to be borne by the parts of the casing 2 that delimit the arc quenching chamber 24 and by the components of the circuit breaker 1 that are disposed in the arc quenching chamber 24.

The pole P2 also comprises a mechanism 30 that can be used to open the circuit breaker 1, that is to say to move the contact elements 20 and 21 from the closed position to the open position, when a malfunction is detected. By way of example, the malfunction is an overload, a short circuit or an excessive level of the electric current flowing in the circuit to be protected by the circuit breaker 1, for at least one of the poles P1 to P4. Detection of this malfunction is ensured by the circuit breaker 1 itself, as explained in more detail below. The mechanism 30 is arranged inside the casing 2, more precisely in the compartment of the internal volume of said casing that is associated with the pole P2. In practice, the mechanism 30 is known per se in the field and will therefore not be described later on here. In other words, the specifics of the mechanism 30 are not restrictive. In the exemplary embodiment under consideration here, the mechanism 30 is designed to set the mobile leg 23 in motion in order to change over the contact elements 20 and 21 between their closed and open positions. The mechanism 30 is advantageously designed so as, when it changes over the contact elements 20 and 21 from their closed position to their open position, to bring about opening of the contact elements of the other poles P1, P3 and P4 of the circuit breaker 1, in particular via mechanisms, similar to the mechanism 30 of the pole P2, that respectively pertain to the poles P1, P3 and P4.

Figure 4:
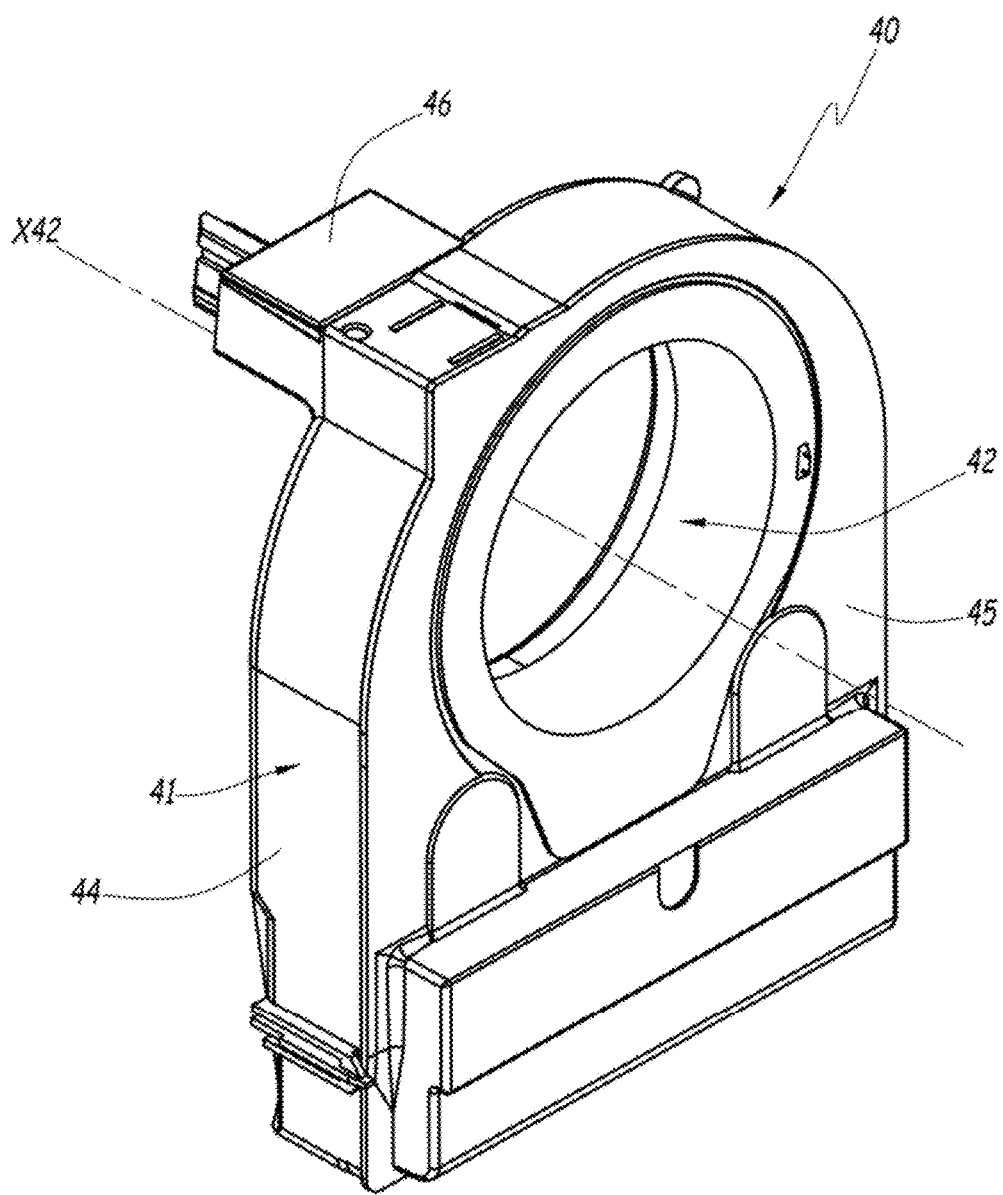
FIG. 4 is a perspective view of a hybrid current sensor consistent with the invention, which is part of the circuit breaker of the preceding figures.
Figure 5:
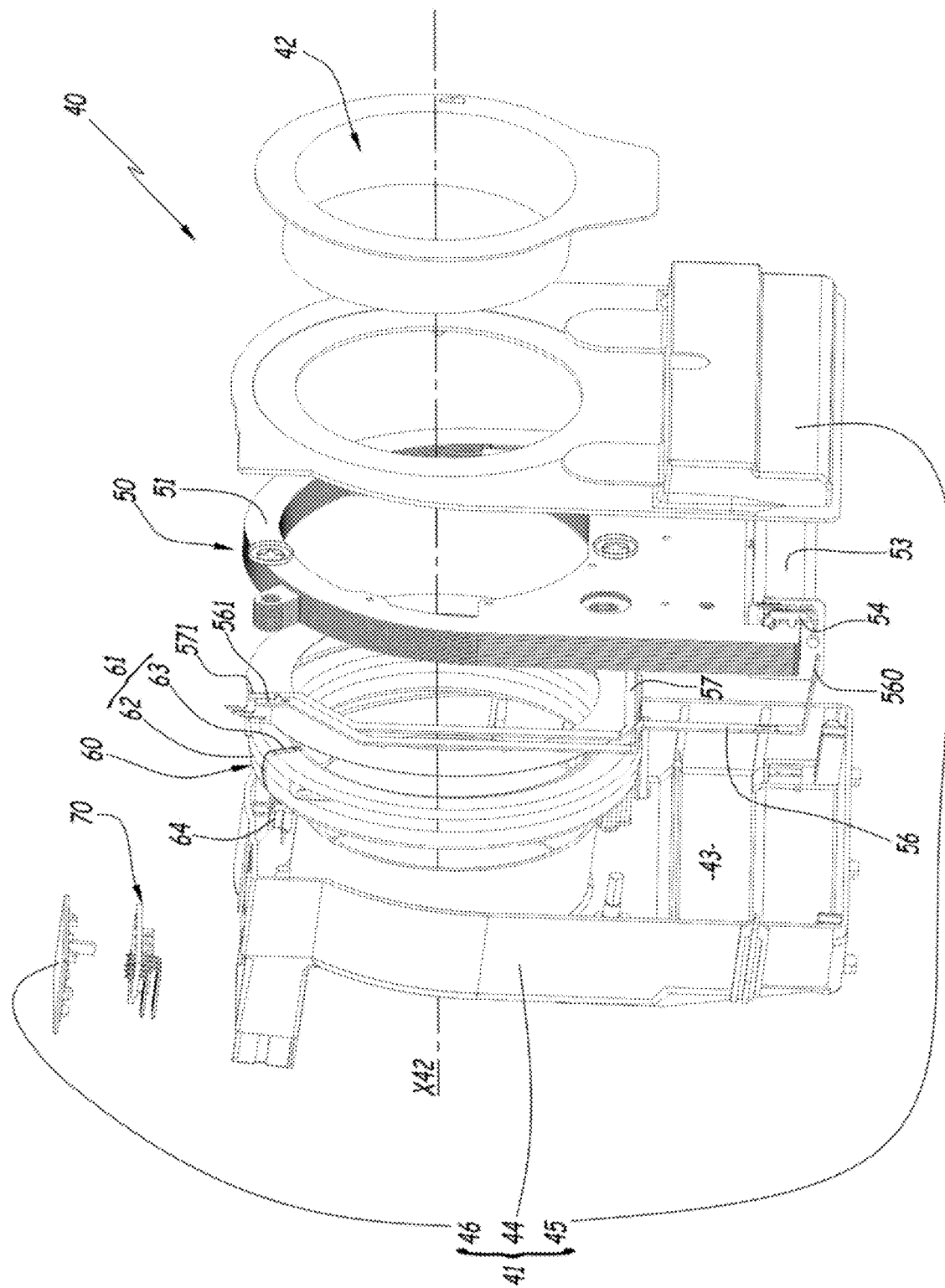
FIG. 5 is an exploded perspective view of the hybrid current sensor of FIG. 4.
Figure 6:
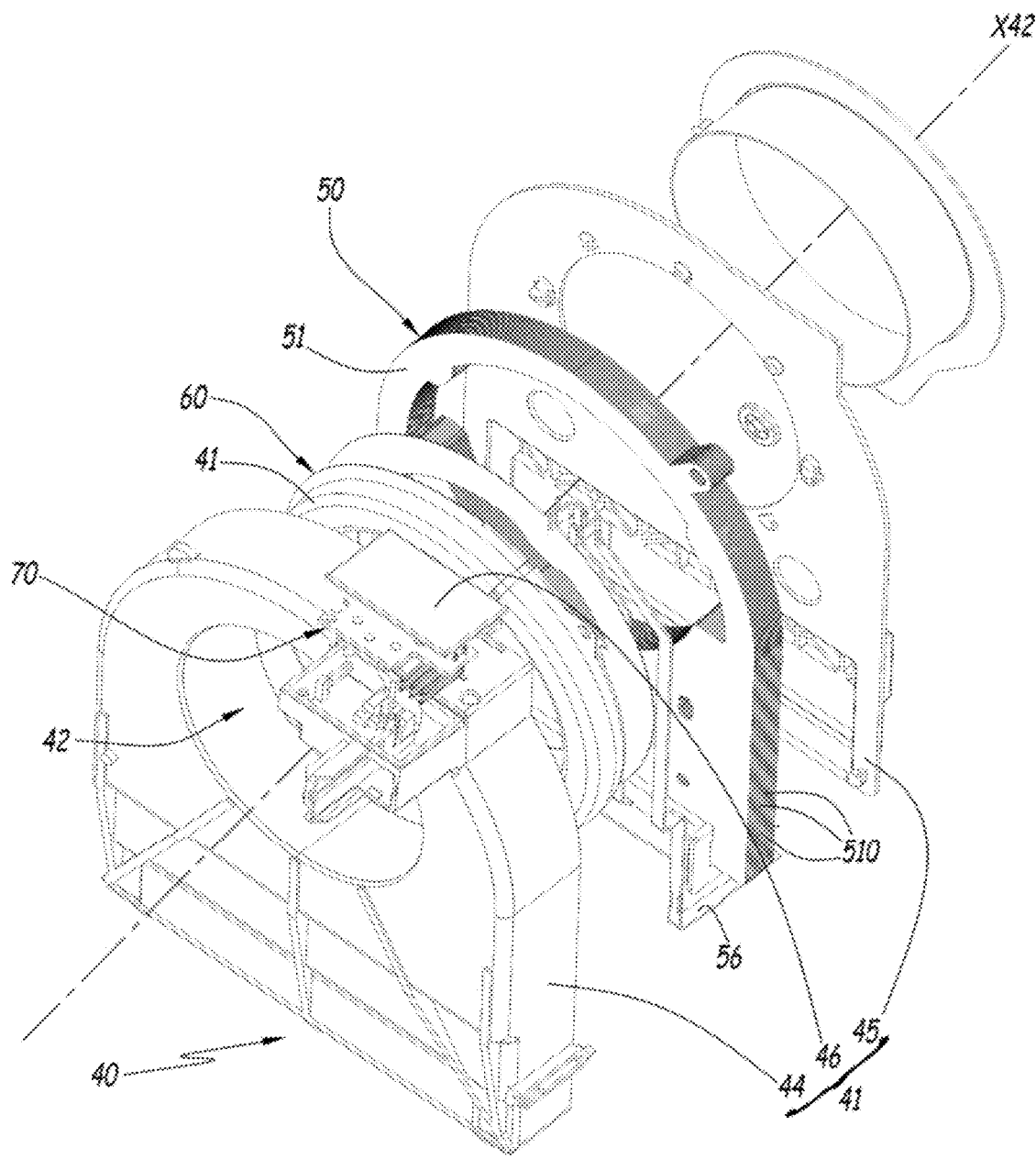
FIG. 6 is a view similar to FIG. 5, from a different viewing angle.

The pole P2 also comprises a hybrid current sensor 40, which can be seen in FIG. 3 and which is shown only in FIGS. 4 to 6.

As can be clearly seen in FIG. 3, the hybrid current sensor 40 is arranged inside the casing 2, more precisely in the compartment of the internal volume of said casing that is associated with the pole P2, by being disposed in the arc quenching chamber 24.

As can be clearly seen in FIGS. 3 and 4, the hybrid current sensor 40 comprises a housing 41 through which a passage 42 passes along a passage axis X42 on which the passage 42 is centred. When the circuit breaker 1 is in the assembled state, the terminal pad 10 is received, here in complementary fashion, in the passage 42 by extending parallel to the passage axis X42, or even, as here, by being aligned with the passage axis X42. The housing 41 thus has the terminal pad 10 passing through it via its passage 42 and is arranged in the arc extinguishing chamber 24 by being disposed, along the passage axis X42, against a part of the casing 2, which itself has the terminal pad 10 passing through it along the passage axis X42.

As can be clearly seen in FIGS. 3 and 5, the housing 41 also delimits an internal volume 43 that is separate from the passage 42 by surrounding the passage 42 all around the passage axis X42. In the exemplary embodiment under consideration in the figures, the housing 41 comprises, for this purpose, a shell 44 and a cover 45 that is joined fixedly to the shell 44, closing it so as to delimit the internal volume 43 between the shell 44 and the cover 45. Other embodiments can be envisaged for the housing 41.

As can be clearly seen in FIGS. 5 and 6, the hybrid current sensor 40 also comprises a magnetic current sensor 50, a current measuring device 60 and an electronic circuit 70, which will be described in more detail hereinbelow and which are all accommodated in the internal volume 43 of the housing 41 when the hybrid current sensor 40 is in the assembled state.

The magnetic current sensor 50 comprises a magnetic circuit 51 that is arranged in the internal volume 43 of the housing 41 so as to surround the passage 42. In the embodiment under consideration here, the magnetic circuit 51 comprises multiple stacked metal plates 510 in direct contact with one another in a direction parallel to the passage axis X42, these metal plates 510 having the passage 42 passing through them, from one part of their stack to the other. Other embodiments can be envisaged for the magnetic circuit 51.

Before the rest of the magnetic current sensor 50 is described, a more detailed description is provided hereinbelow of the current measuring device 60 and the electronic circuit 70, referring to FIGS. 5 and 6.

The current measuring device 60 comprises a Rogowski coil 61 that is arranged in the internal volume 43 of the housing 41 so as to surround the passage 42. In the exemplary embodiment under consideration in the figures, the Rogowski coil 61 comprises a metal electrical wire 62, which is not shown in detail in the FIGS. and which is made of copper or of a copper-based alloy, for example. The electrical wire 62 is wound on an insulating former 63, which is produced in a non-magnetic material. The former 63 surrounds the passage 62 all around the passage axis X42 and, here, has a generally annular shape with a circular base, centred on the passage axis X42. Other embodiments can be envisaged for the Rogowski coil 61.

In every case, the magnetic circuit 51 of the magnetic current sensor 50 and the Rogowski coil 61 of the current measuring device 60 are designed so as, during operation, to surround the same electrical conductor forming a primary circuit for each of them, that is to say a primary circuit for the magnetic circuit 51 and a primary circuit for the Rogowski coil 61, this electrical conductor passing through the hybrid current sensor 40 by way of the passage 42 in its housing 41. In the embodiment under consideration here, where the hybrid current sensor 40 is used in the circuit breaker 1, the electrical conductor forming a primary circuit for the magnetic circuit 51 and for the Rogowski coil 61 is constituted by the terminal pad 10 that, when the circuit breaker 1 is in the assembled state, is received in the passage 42 and is thus surrounded, all around the passage axis X42, by both the magnetic circuit 51 and the Rogowski coil 61, as shown in FIG. 3.

The Rogowski coil 61 is connected to the electronic circuit 70 to allow said electronic circuit to process the electric current flowing in the Rogowski coil 61. The embodiment of the connection between the Rogowski coil 61 and the electronic circuit 70 is not restrictive. In the embodiment under consideration in the figures, the current measuring device 60 comprises, for this purpose, a connecting cassette 64 that, while ensuring electrical connection between ends of the Rogowski coil 61 and terminals of the electronic circuit 70, can be used to ensure relative fixation and relative positioning between the Rogowski coil 61 and the electronic circuit 70 in the housing 41. In particular, the connecting cassette 64 extends from the Rogowski coil 61 into a dedicated recess of the internal volume 43, at the end of which the electronic circuit 70 is arranged and which, here, is closed by a related cap 46 of the housing 41.

Whatever the specifics of the connection between the Rogowski coil 61 and the electronic circuit 70, said electronic circuit is configured so as, on the basis of the electric current flowing in the Rogowski coil 61, to detect and measure the electric current flowing in the electrical conductor forming the primary circuit of the Rogowski coil 61, in other words, here, to detect and measure the electric current in the terminal pad 10 when the circuit breaker 1 is in the assembled state. This is because, during operation, the current flowing in the Rogowski coil 61 provides a measurement signal that represents the electric current flowing in the terminal pad 10, the electronic circuit 70 being designed to process this measurement signal. In particular, the voltage across the terminals of the Rogowski coil 61 is directly proportional to the level of the electric current in the terminal pad 10. The absence of a magnetic core that risks being saturated allows a wide measurement dynamic range. In practice, the electronic means for acquiring and measuring the current, which are part of the electronic circuit 70, are known per se in the field and will not be described later on here, as the embodiment of these electronic means is not restrictive.

Moreover, the electronic circuit 70 here is designed to control the mechanism 30 of the circuit breaker 1 by sending it an activation signal when the processing performed by the electronic circuit 70 reveals the aforementioned malfunction. In other words, when the electronic circuit 70 detects such a malfunction, the mechanism 30 is controlled by the electronic circuit 70 to move the contact elements 20 and 21 from their closed position to their open position.

We will now return to the detailed description of the rest of the magnetic current sensor 50, referring more particularly to FIGS. 7 to 11.

Figure 7:
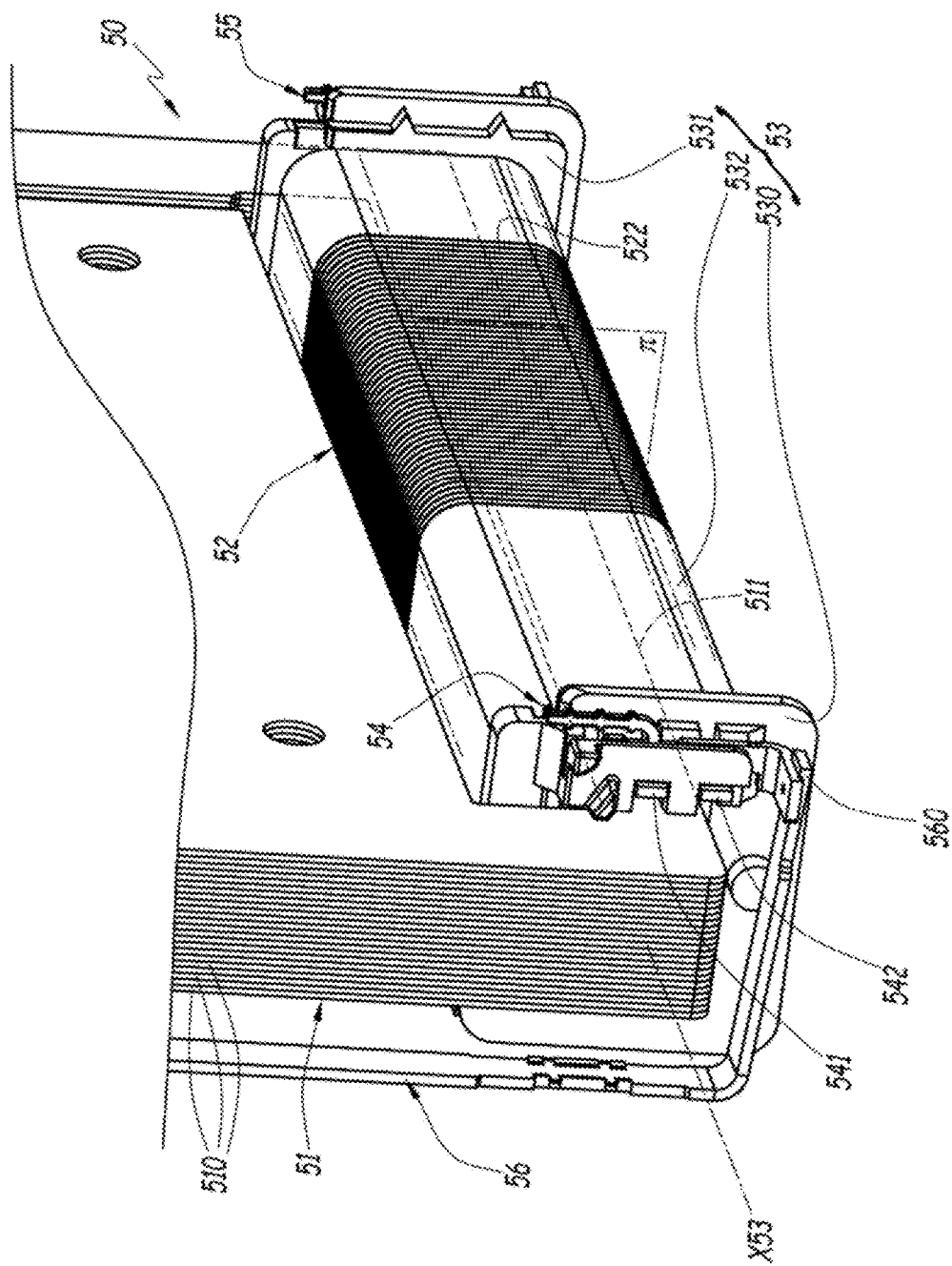
FIG. 7 is a perspective view of a part of a magnetic current sensor consistent with the invention, which is part of the hybrid current sensor of FIGS. 4 to 6.

The magnetic current sensor 50 comprises, besides its magnetic circuit 51, an electrical winding 52. For reasons of clarity, this winding 52 is not shown in FIGS. 3, 5, 6 and 10 and is shown only in part and schematically in FIGS. 7 to 9. The winding 52 is constituted by a metal wire, preferably made of copper or of a copper-based alloy, which is wound around a portion 511 of the magnetic circuit 51, with the interposition of an insulating coil 53, which is part of the magnetic current sensor 50. Here, the portion 511 of the magnetic circuit 51, which is indicated in dashed lines in FIG. 7, is remote from the passage 42 with respect to the passage axis X42 by being constituted by the part of the magnetic circuit 51 that is furthest away from the passage 42.

Figure 8:
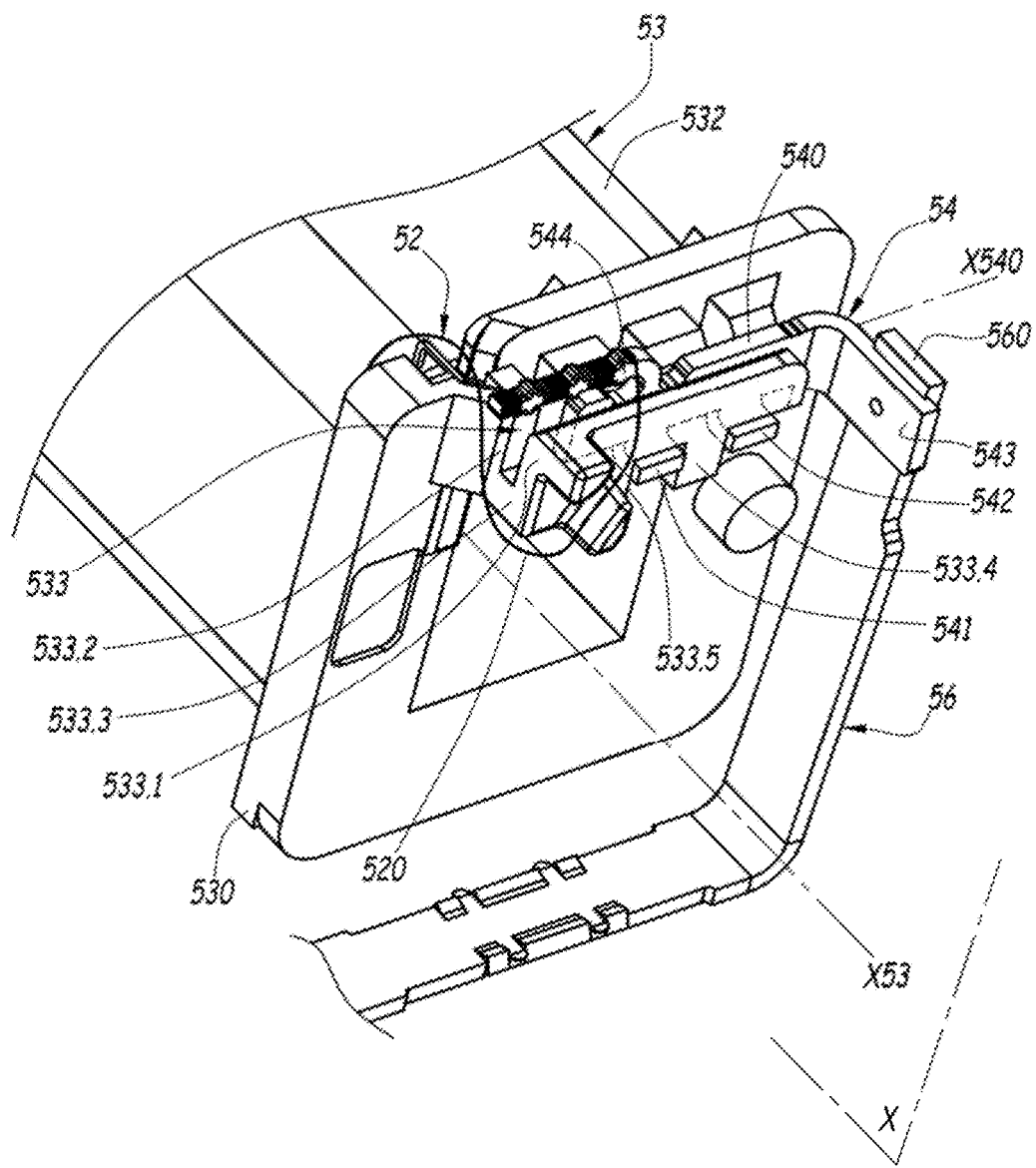
FIG. 8 is a perspective view of a part of only some components of the magnetic current sensor of FIG. 7.
Figure 9:
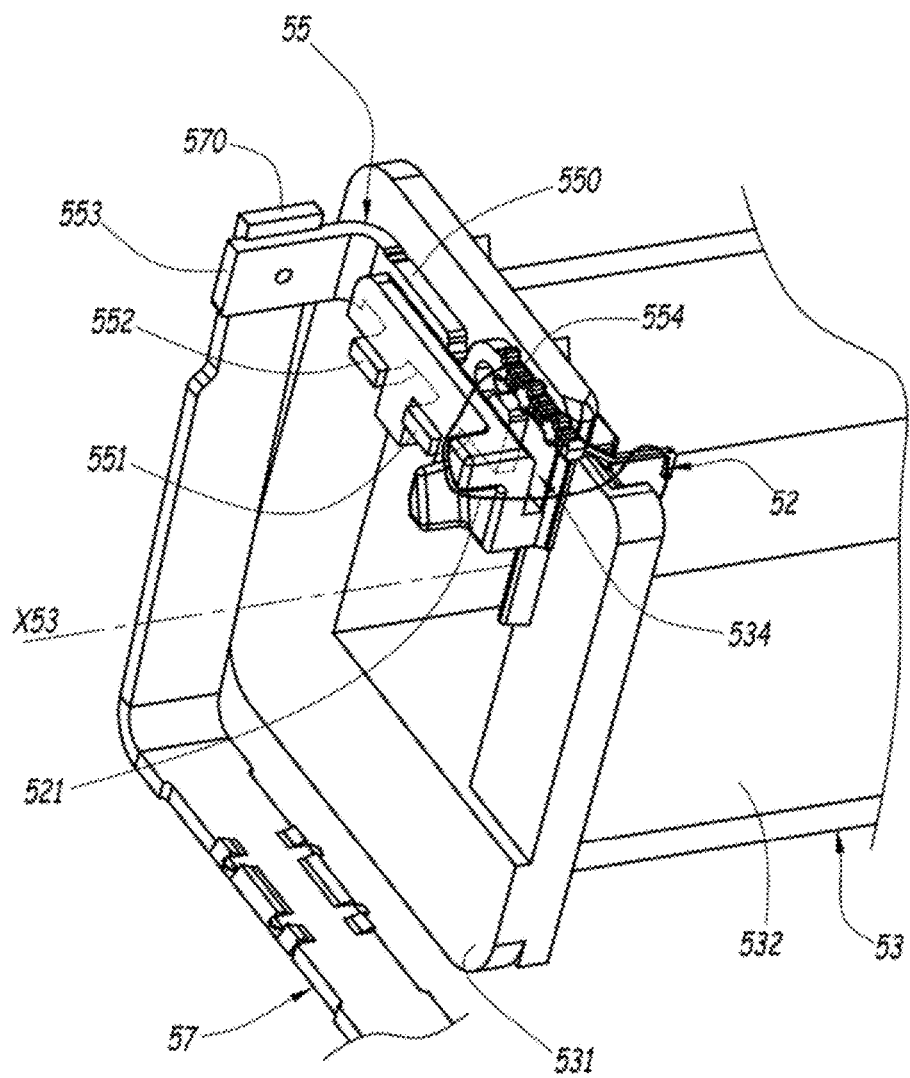
FIG. 9 is a view similar to FIG. 8, showing another part of the magnetic current sensor.

More precisely, the winding 52 includes two ends 520 and 521, which are respectively shown only in FIGS. 8 and 9 and which are respectively constituted by the opposite ends of the metal wire that constitutes this winding. The winding 52 also includes a wound extensive part 522, which is shown schematically only in FIG. 7 and which connects the ends 520 and 521 to one another.

The coil 53, which is produced in a non-magnetic material, defines a coil axis X53, on which the coil 53 is centred and along which the coil 53 is internally hollow. When the magnetic current sensor 50 is in the assembled state, the coil axis X53 extends remotely and transversely to the passage axis X42, in particular at right angles to this passage axis X42. In the embodiment under consideration in the figures, the coil 53 has a tubular shape, which is centred on the coil axis X53 and has a square cross-section with rounded corners. Other geometries can be envisaged for the coil 53. In every case, as can be clearly seen in FIGS. 7 and 10, the coil 53 includes two terminal parts 530 and 531, which are opposite one another along the coil axis X53 and which are connected to one another by an elongate extensive part 532 of the coil 53. The coil 53 is interposed, radially in relation to the coil axis X53, between the portion 511 of the magnetic circuit 51 and the winding 52. The portion 511 of the magnetic circuit 51 is received inside the coil 53 by successively extending inside the terminal part 530, the elongate extensive part 532 and the terminal part 531 and emerging outside the coil 53 from each of the terminal parts 530 and 531 along the coil axis X53. The winding 52 is wound coaxially in relation to the coil 53, its wound extensive part 522 being wound over multiple turns around and along the elongate extensive part 532 of the coil 53, and is thus arranged around the portion 511 of the magnetic circuit 51, while the ends 520 and 521 of the winding 52 are respectively disposed, along the coil axis X53, at the terminal parts 530 and 531 of the coil 53.

As shown in FIGS. 7 to 10, the magnetic current sensor 50 also comprises two leads 54 and 55, which are respectively mounted on the terminal parts 530 and 531 of the coil 53 and which are respectively electrically connected to the ends 520 and 521 of the winding 52. The lead 54 can be used to ensure electrical connection of the end 520 of the winding 52 while ensuring fixed mechanical connection of this end 520 of the winding 52 to the terminal part 530 of the coil 53. The lead 55 can be used to ensure electrical connection of the end 521 of the winding 52 while ensuring fixed mechanical connection of this end 521 of the winding 52 to the terminal part 531 of the coil 53. In practice, the leads 54 and 55 are produced from a metal material for this purpose.

Before the leads 54 and 55 are described in more detail, it will be noted that the magnetic current sensor 50 also comprises two electrical tracks 56 and 57 that respectively connect the leads 54 and 55 to a load so that the winding 52 is able to supply power to this load. In the embodiment under consideration here, the aforementioned load is the electronic circuit 70: thus, when the hybrid current sensor 40 is in the assembled state, the electronic circuit 70 is supplied with power by the winding 52 by way of the electrical tracks 56 and 57, as can be clearly seen in FIGS. 5 to 10.

Each of the electrical tracks 56 and 57 comprises two opposite ends 560 and 561, and 570 and 571, respectively. The end 560 of the electrical track 56, or 570 of the electrical track 57, is connected, in particular by welding, to the lead 54, or 55, as explained in detail below with reference to the detailed description of the leads 54 and 55. The end 561 of the electrical track 56, or 571 of the electrical track 57, is connected, in particular by welding, to the electronic circuit 70, the specifics of this connecting assembly between the electrical tracks 56 and 57 and the electronic circuit 70 not being restrictive.

Returning now to the detailed description of the leads 54 and 55, it will be noted that these two leads 54 and 55 are not identical to one another in the sense that they are not interchangeable with one another on account of their structural arrangement, which will be explained in detail hereinbelow. While that is the case, the two leads 54 and 55 are functionally similar to one another, being structurally matched to the terminal part 530 or 531 of the coil 53 on which they are respectively mounted. In the embodiment under consideration in the figures, the leads 54 and 55 are advantageously symmetrical to one another with respect to a geometric plane $\pi$, which is indicated in FIG. 7 and which is perpendicular to the coil axis X53. Consequently, for convenience, a detailed description will be provided hereinbelow of the lead 54, shown on its own in FIG. 11, it being understood that the description of the lead 55 can be inferred directly therefrom, in particular by way of symmetry with respect to the geometric plane Tr.

The lead 54 comprises a main body 540. As can be clearly seen in FIGS. 8 and 10, the main body 540 is received in complementary fashion in a recess 533 made in the terminal part 530 of the coil 53. The recess 533 is closed both by two lateral walls 533.1 and 533.2, which are part of the terminal part 530 and which are arranged opposite one another in a direction parallel to the coil axis X53, and by an end wall 533.3, which is part of the terminal part 530 and which connects the respective edges, which face the coil axis X53, of the lateral walls 533.1 and 533.2 to one another, parallel to the coil axis X53. The recess 533 is open between the lateral walls 533.1 and 533.2 other than the end wall 533.3, in particular between the respective edges, which face away from the coil axis X53, of the lateral walls 533.1 and 533.2.

Figure 10:
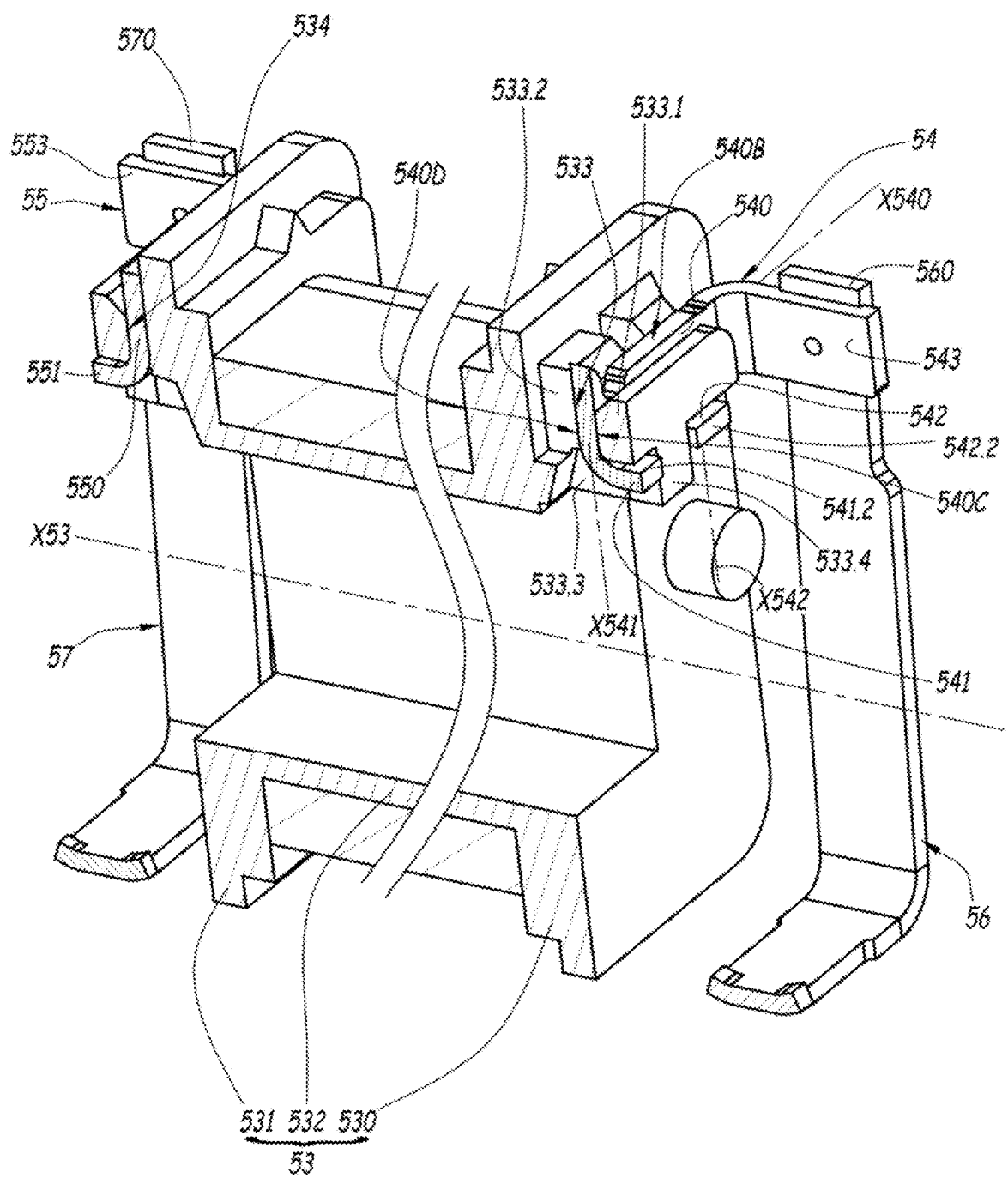
FIG. 10 is a section along the plane X in FIG. 8.
Figure 11:
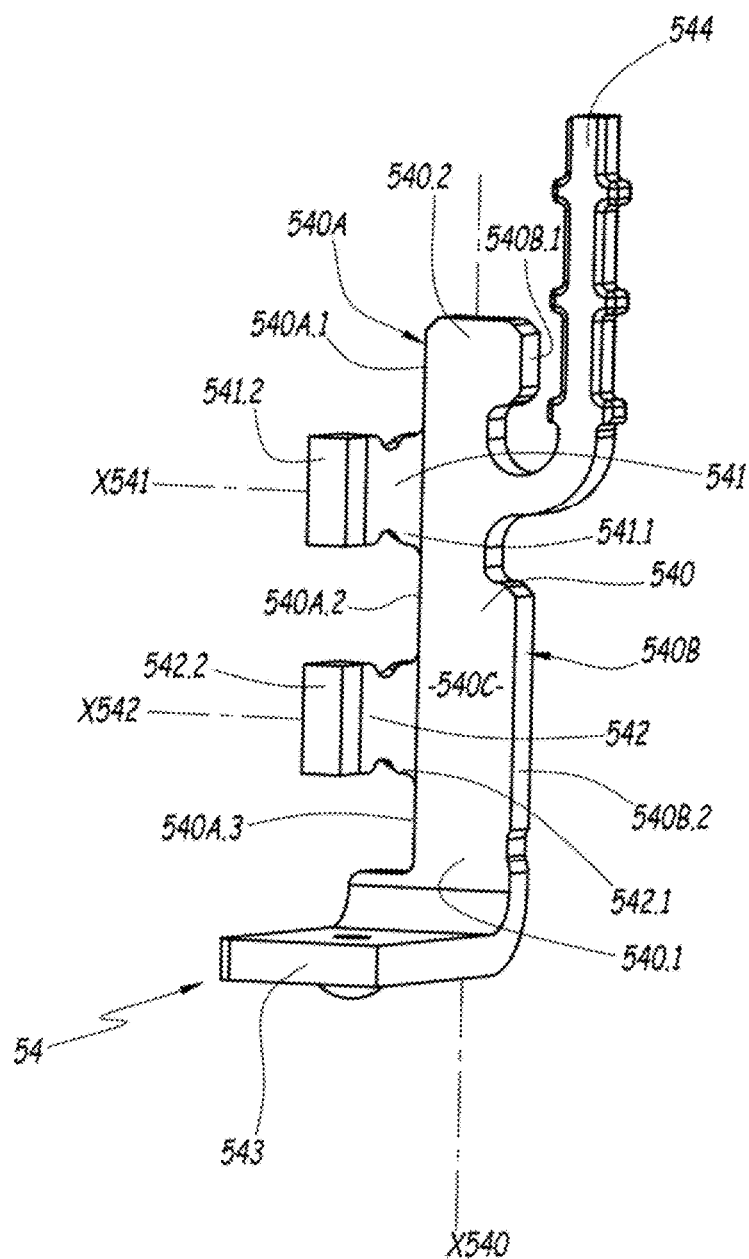
FIG. 11 is a perspective view of one of the components of FIG. 8, shown on its own.

As can be seen clearly in FIGS. 8, 10 and 11, the main body 540 has an elongate shape along a body axis X540. When the magnetic current sensor 50 is in the assembled state, the body axis X540 extends remotely and transversely to the coil axis X53, in particular at right angles to the coil axis X53.

As indicated in FIG. 11, the main body 540 includes two longitudinal ends 540.1 and 540.2, which are opposite one another along the body axis X540, and from one to the other of which the main body extends along the body axis. Moreover, the main body 540 is provided:

with a lateral face 540A that, when the magnetic current sensor 50 is in the assembled state, faces the coil axis X53, with a lateral face 540B, which is opposite the lateral face 540A and which, when the magnetic current sensor 50 is in the assembled state, faces away from the coil axis X53, and with two lateral faces 540C and 540D, which connect the lateral faces 540A and 540B to one another and which are either side of the main body in a direction parallel to the coil axis X53.

The lead 54 also comprises two tongues 541 and 542. As can be clearly seen in FIGS. 10 and 11, the tongues 541 and 542 protrude from the lateral face 540A of the main body 540, running from respective ends 541.1 and 542.1 joined to the main body 540 up to respective free ends 541.2 and 542.2. As can be clearly seen in FIGS. 8, 10 and 11, the tongues 541 and 542 are remote from one another along the body axis X540. At their end 541.1, 542.1 joined to the main body 540, the tongues 541 and 542 extend from the lateral face 540A of the main body 540 along respective tongue axes X541 and X542, which are parallel to one another and which, when the magnetic current sensor 50 is in the assembled state, each extend transversely to the coil axis X53 and to the body axis X540, in particular at right angles to the coil axis X53 and perpendicularly to the body axis X540. Between their end 541.1, 542.1 joined to the main body 540 and their free end 541.2, 542.2, the tongues 541 and 542 are folded against the same lateral wall of the recess 533, namely the lateral wall 533.1, so as to keep the lead 54 in position with respect to the coil 53.

In practice, to allow the tongues 541 and 542 to be folded against the lateral wall 533.1 of the recess 533, the tongues 541 and 542 pass through the end wall 533.3, which is therefore perforated, as can be clearly seen in FIG. 10.

To improve the effectiveness and durability of the keeping of the lead 54 in position on the coil 53 by way of the folded shape of the tongues 541 and 542, each of these tongues 541 and 542 is advantageously folded 95°±5° against the lateral wall 533.1 of the recess 533. In this way, any relaxation related to unfolding does not adversely affect the keeping of the lead 55 in position on the coil 53.

There is advantageously provision for the lead 54 to be kept in position with respect to the terminal part 530 of the coil 53, by way of the tongues 541 and 542, parallel to the tongue axes X541 and X542. To this end, as can be clearly seen in FIGS. 8 and 10, the tongues 541 and 542 are advantageously folded so as to abut, in a direction parallel to the tongue axes X541 and X542 and with opposite orientation to the coil axis X53, the lateral wall 533.1 of the recess 533, in particular an edge of this lateral wall 533.1 that faces the coil axis X53. In this way, the tongues 541 and 542 prevent the main body 540 of the lead 54 from coming out of the recess 533 in this direction. In a direction opposite the aforementioned direction, that is to say a direction parallel to the tongue axes X541 and X542 but facing the coil axis X53, the lateral face 540A of the main body 540 is advantageously pressed against the end wall 533.3 of the recess 533: more precisely, this lateral face 540A of the main body 540 includes bearing surfaces 540A.1, 540A.2 and 540A.3, which are thus pressed against the end wall 533.3 and which, as indicated in FIG. 11, are located on either side, along the body axis X540, of at least one of the tongues 541 and 542, or even, as here, of both tongues 541 and 542. In this way, the lead 54 is effectively stabilized at the bottom of the recess 533 parallel to the tongue axes X541 and X542, give or take operating clearances.

There is also advantageously provision for the lead 54 to be kept in position with respect to the terminal part 530 of the coil 53, by way of the tongues 541 and 542, parallel to the body axis X540. To this end, as can be clearly seen in FIGS. 8 and 10, the tongues 541 and 542 are advantageously folded so as to abut, in directions parallel to the body axis X540 and opposite one another, the lateral wall 533.1 of the recess 533, in particular parts 533.4 and 533.5 of the lateral wall 533.1 that protrude from the edge of said lateral wall that faces the coil axis X53, as can be clearly seen in FIGS. 8 and 10. In this way, the tongues 541 and 542 immobilize the main body 540 in the recess 533 parallel to the body axis X540, specifically in both possible opposite directions.

As far as keeping the lead 54 in position parallel to the coil axis X53 is concerned, this is advantageously ensured, give or take clearances, by way of the lateral walls 533.1 and 533.2 of the recess 533, the relative spacing of which along the coil axis X53 is substantially equal to the thickness of the main body 540, that is to say to the dimension of said main body between its lateral faces 540C and 540D.

Besides the tongues 541 and 542, the lead 54 includes other arrangements protruding from its main body 540, as explained in detail below.

Thus, the lead 54 includes a leg 543 that, as can be clearly seen in FIGS. 8, 10 and 11, extends at an angle from the longitudinal end 540.1 of the main body 540, it being pointed out that the tongues 541 and 542 and this leg 543 are all bent towards the same lateral side of the main body 540, namely the one corresponding to its lateral face 540C. The leg 543 can be used to connect the lead 54 to the electrical track 56: for this purpose, the leg 543 is joined, in particular by welding, to the electrical track 56, more precisely to the end 560 of said electrical track. In practice, the welded joint between the leg 543 and the end 560 of the electrical track 56 is advantageously produced by brazing, for example using a tin-based solder.

Continuing the above considerations, it is preferable for, as in the embodiment under consideration in the figures, the respective free ends 541.2 and 542.2 of the tongues 541 and 542 not to emerge substantially from the lateral wall 533.1 of the recess 533. In other words, preferably, each of the tongues 541 and 542 is, at its free end 541.2, 542.2, substantially flush with the lateral wall 533.1 of the recess 533. In this way, the assembly operations, in particular welding, between the leg 543 and the electrical track 56 are facilitated in the sense that these assembly operations are not hampered by the presence of the tongues 541 and 542, which remain essentially set back from the face of the lateral wall 533.1, which faces, along the coil axis X53, the side where the leg 543 is bent.

Moreover, the lead 54 includes a mast 544 that, as can be clearly seen in FIGS. 8 and 11, protrudes from the lateral face 540B of the main body 540. This mast 544 is angled towards the longitudinal end 540.2 of the main body 540 so as to extend along the lateral face 540B of the main body 540. The mast 544 can be used to connect the end 520 of the winding 52 to the lead 54. For this purpose, the end 520 of the winding 52 is joined, in particular by welding, around the mast 544, as indicated schematically in FIG. 8. In practice, as shown schematically in FIG. 8, the end 520 of the winding 52 is wound one or more times around the mast 544, while being welded there by brazing, for example using a tin-based solder.

In so far as the winding 52 extends, at the terminal part 530 of the coil 53, into the region of this terminal part 530 where the angled mast 544 is located, it is preferable, as in the embodiment under consideration in the figures, for the lead 54 not to continue, along the body axis X540, from the longitudinal end 540.2 of the main body 540 to outside the recess 533, as can be clearly seen in FIG. 8. This is because, in this way, the lead 54, in particular its main body 540, does not risk interfering with the winding 52, apart from at the, in particular welded, joint between the end 520 of the winding 52 and the mast 544: the risks of the lead 54 damaging, in particular as a result of cutting through, the winding 52 are thus removed.

Furthermore, according to an advantageous arrangement, the advantage of which will become apparent a little later on, the lateral face 540B of the main body 540 includes bearing surfaces 540B.1 and 540B.2 that are situated on either side, along the body axis X540, of the mast 544.

As indicated earlier on, the detailed description that has just been provided for the lead 54 applies to the lead 55, nevertheless taking account of the fact that, firstly, the lead 55 is mounted on the terminal part 531 of the coil 533, and not on the terminal part 530 on which the lead 54 is mounted, and, secondly, the lead 55 is connected to the end 521 of the winding 52, and not to the end 520 to which the lead 54 is connected, as shown in FIG. 9. Thus, without describing them with the same level of detail as hereinabove for the lead 54, the lead 55 comprises a main body 550, two tongues 551 and 552, a leg 553 and a mast 554, which are functionally similar to, respectively, the main body 540, the tongues 541 and 542, the leg 543 and the mast 544, while also advantageously being respectively symmetrical to these with respect to the geometric plane Tr. Of course, the terminal part 531 of the coil 53 is arranged accordingly, in particular by making a recess 534 that is similar to the recess 533, as can be clearly seen in FIG. 9.

As explained hitherto, the leads 54 and 55 have numerous advantages directed to making the connection of the winding 52 more reliable and stronger at the terminal parts 530 and 531 of the coil 53.

Figure 12:
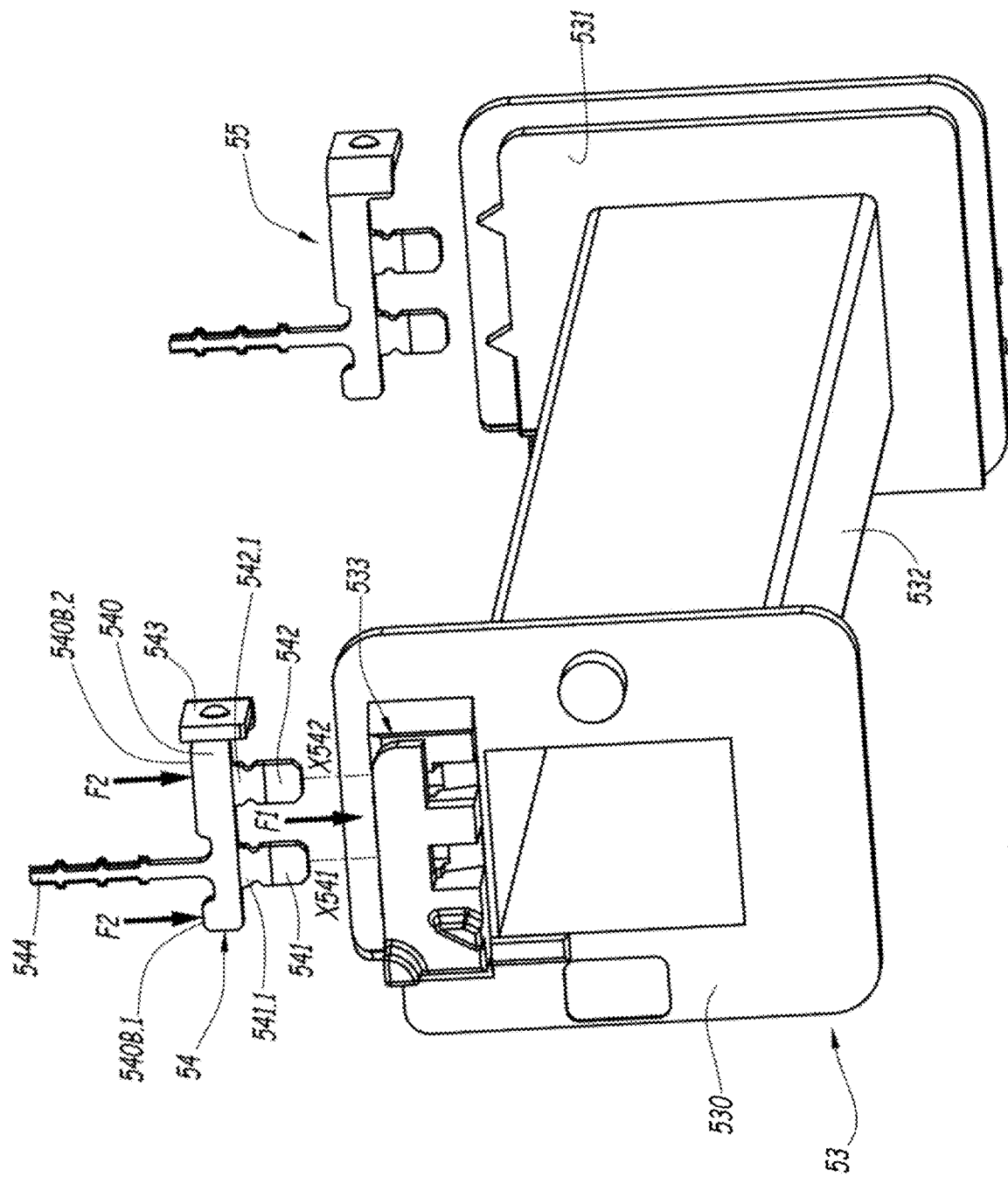
FIG. 12 is a perspective view illustrating the components shown in FIGS. 8 to 11 before they are assembled.
Figure 13:
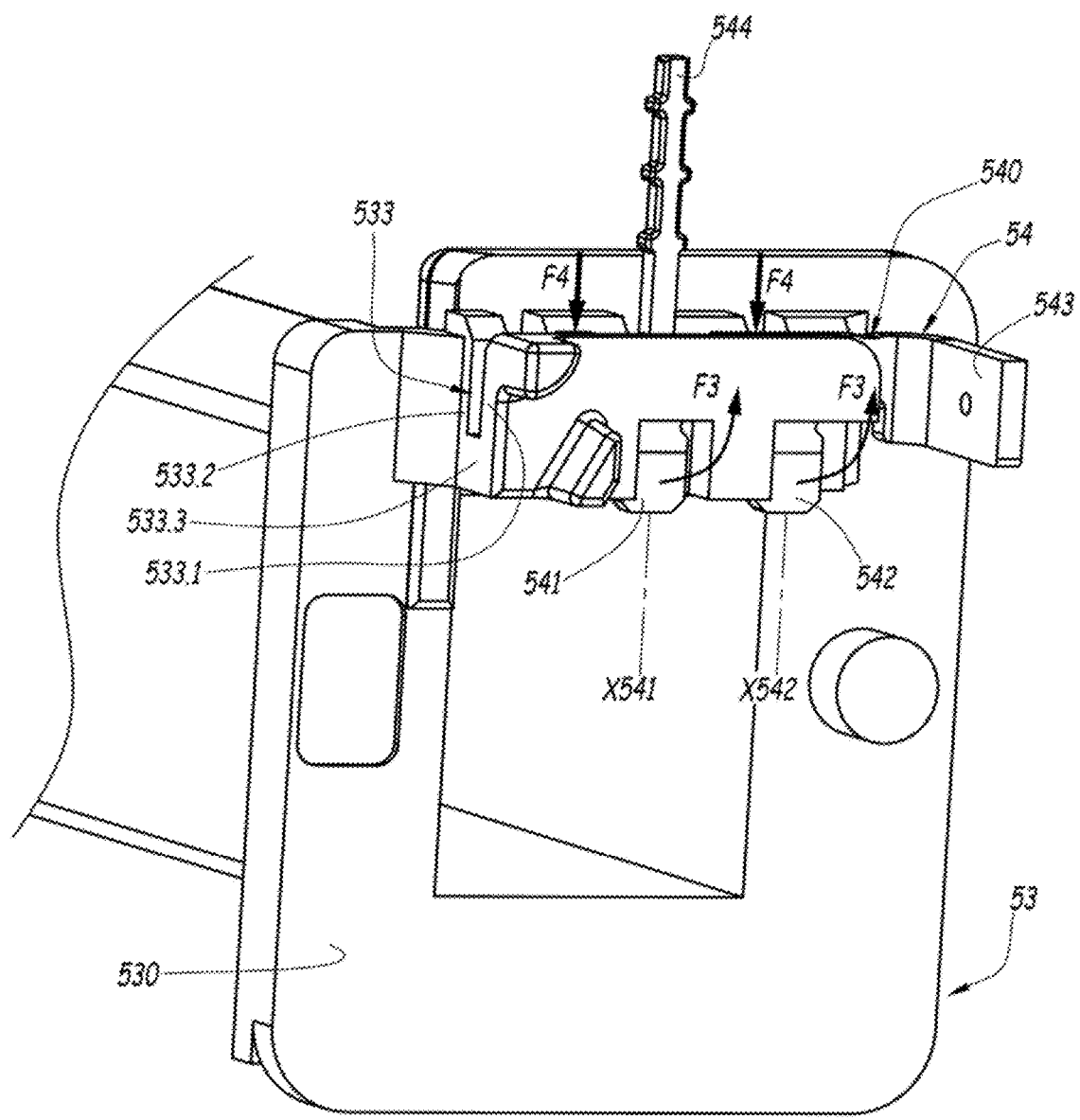
FIGS. 13 and 14 are perspective views illustrating successive operations for assembling the components of FIG. 11.
Figure 14:
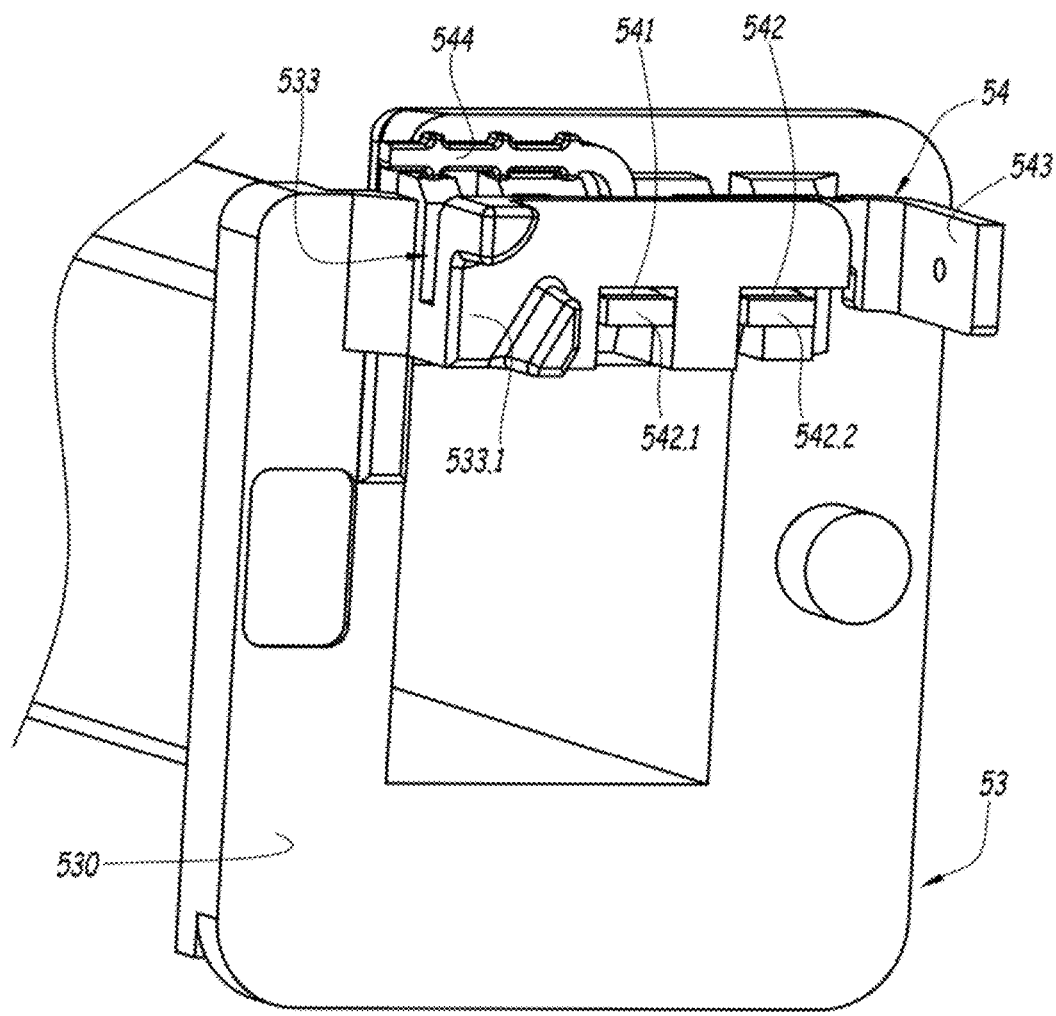

The leads 54 and 55 also prove to be particularly easy and practical to join to the rest of the magnetic current sensor 50. Thus, FIGS. 12 to 14 illustrate three successive moments in assembly operations between the leads 54 and 55 and the coil 53. Hereinafter, a detailed description is provided for the assembly operations relating to the lead 54, it being understood that the assembly operations relating to the lead 55 are similar.

Initially, that is to say before the lead 54 is effectively joined to the coil 53, the lead 54 is available with its tongues 541 and 542 and its mast 544 in an as yet unbent state, as illustrated in FIGS. 12 and 13. The tongues 541 and 542 then extend, over their whole extent from their end 541.1, 542.1 joined to the main body 540, respectively along the tongue axes X541 and X540. Similarly, the mast 544 extends, over its whole extent from its end joined to the main body 540, in a direction parallel to the tongue axes X541 and X542.

The lead 54 is then brought back to the terminal part 530 of the coil 53 by being introduced into the recess 533 in a direction parallel to the tongue axes X541 and X542 and facing the coil axis X53, as indicated by the arrow F1 in FIG. 12. For this purpose, a tool that is applied against the bearing surfaces 5406.1 and 5406.2 in the aforementioned direction is advantageously used, as indicated by the arrows F2 in FIG. 12.

Once the lead 54 has been completely introduced into the recess 533, the tongues 541 and 542 are bent, as indicated by the arrows F3 in FIG. 13, so as to fold the tongues 541 and 542 against the lateral wall 533.1 of the recess 533 and thus to arrive at the assembly shape of these tongues, which was described previously with reference to FIGS. 7 to 11. For this purpose, an ad hoc folding tool is used, which is partially introduced inside the coil 53 as appropriate. Advantageously, during the operation of bending the tongues 541 and 542, the main body 540 is held in place in the recess 533 by applying an ad hoc tool to the bearing surfaces 5406.1 and 5406.2 along the tongue axes X541 and X542, as indicated by the arrows F4 in FIG. 13.

To then change over from the assembly state illustrated in FIG. 13 to the assembly state illustrated in FIG. 14, the tongues 541 and 542 are levelled off at their free end 541.2 and 542.2 in order to make these free ends 541.2 and 542.2 substantially flush with the lateral wall 533.1 of the recess 533, as explained earlier on. Moreover, the mast 544 is bent, advantageously after having been joined to the end 521 of the winding 52, as explained earlier on.

From the assembly state illustrated in FIG. 14, the electrical track 56 can be joined, in particular welded, to the leg 543, as explained earlier on.

Finally, different arrangements and variants for the circuit breaker 1, the hybrid current sensor 40 and the magnetic current sensor 50 that have been described hitherto can be envisaged. By way of example, the different variants that have been mentioned at various junctures in the description hereinabove can be combined with one another, at least in part.

The invention claimed is:
1. A magnetic current sensor, comprising:
a magnetic circuit that is designed to surround an electrical conductor forming a primary circuit for the magnetic circuit,
an electrical winding, which includes two ends and also an extensive part that connects the two ends and that is wound around a portion of the magnetic circuit,
an insulating coil, which defines a coil axis on which the coil is substantially centred, and which includes two terminal parts that are opposite one another along the coil axis, the coil being radially interposed between said portion of the magnetic circuit, which is received inside the coil, and the winding, which is wound coaxially on the coil, and
two leads, which are respectively mounted on the terminal parts of the coil and which are respectively connected to the ends of the winding, wherein each lead includes a main body that is:
received in complementary fashion in a recess made in the corresponding terminal part of the coil,
elongate along a body axis extending transversely to the coil axis, and
provided with a first lateral face, which faces the coil axis, and with a second lateral face, which faces away from the coil axis, and wherein each lead also includes two tongues that:
protrude from the first lateral face of the main body, each running from an end joined to the main body up to a free end,
are remote from one another along the body axis,
at their end joined to the main body, extend from the first lateral face of the main body along respective tongue axes, which are parallel and each extend transversely to the coil axis and to the body axis, and
between their end joined to the main body and their free end, are folded against the same lateral wall of the corresponding recess so as to keep the lead in position with respect to the coil.

2. The magnetic current sensor according to claim 1, wherein each tongue is folded 95°+5° against the lateral wall of the corresponding recess.

3. The magnetic current sensor according to claim 1, wherein the tongues of each lead are folded so as to abut the lateral wall of the corresponding recess in a direction parallel to the tongue axes in order to prevent the main body from coming out of the recess in this direction.

4. The magnetic current sensor according to claim 1, wherein the tongues of each lead are folded so as to abut the lateral wall of the corresponding recess in directions that are parallel to the body axis and opposite one another, in order to immobilize the main body in the recess in these directions.

5. The magnetic current sensor according to claim 1, wherein the first lateral face of the main body of each lead includes first bearing surfaces that are:
located on either side, along the body axis, of at least one of the two tongues of the lead, and
pressed, in a direction parallel to the tongue axes, against an end wall of the corresponding recess.

6. The magnetic current sensor according to claim 1, wherein each tongue of each lead is, at its free end, substantially flush with the lateral wall of the corresponding recess.

7. The magnetic current sensor according to claim 1, wherein the two leads are symmetrical to one another with respect to a geometric plane that is perpendicular to the coil axis, but without being interchangeable with one another.

8. The magnetic current sensor according to claim 1, wherein the magnetic current sensor also comprises two electrical tracks that respectively connect the leads to a load so that the winding is able to supply power to this load.

9. The magnetic current sensor according to claim 8, wherein each lead moreover includes a leg that:
   extends at an angle from a first of the two longitudinal ends of the main body, the tongues of the lead and the leg all being bent towards the same lateral side of the main body, and
   is joined, in particular by welding, to the electrical track associated with the lead, in order to connect this electrical track to the lead.

10. The magnetic current sensor according to claim 9, wherein each lead does not continue, along the body axis, from the second longitudinal end of the main body to outside the corresponding recess.

11. The magnetic current sensor according to claim 9, wherein each lead moreover includes a mast:
   that protrudes from the second lateral face of the main body,
   that is angled towards the second longitudinal end of the main body so as to extend along the second lateral face of the main body, and
   around which the end of the winding that is associated with the lead is joined, in particular by welding, in order to connect this end of the winding to the lead.

12. The magnetic current sensor according to claim 11, wherein the second lateral face of the main body of each lead includes second bearing surfaces that are:
   located on either side, along the body axis, of the mast, and
   suitable for, prior to the mast being bent, applying a tool thereto for inserting and/or holding the main body in place in the corresponding recess, in particular while the tongues are bent.

13. A hybrid current sensor, comprising:
   a magnetic current sensor according to claim 8,
   a current measuring device, comprising a Rogowski coil, the magnetic circuit of the magnetic current sensor and the Rogowski coil being designed to surround the same electrical conductor forming a primary circuit for each of them, and
   an electronic circuit, which is configured to detect and measure an electrical current in said electrical conductor on the basis of the current flowing in the Rogowski coil, the electronic circuit being supplied with power by the winding of the magnetic current sensor by being connected to the leads via electrical tracks.

14. A circuit breaker, comprising one or more poles and also an insulating casing, which bears the pole or poles, wherein the or each pole comprises:
   two terminal pads, which are supported by the casing and which can be connected from the outside of the casing to an electrical circuit that is to be protected by the circuit breaker,
   two contact elements, which are disposed in an arc quenching chamber delimited inside the casing, and which are respectively connected to the terminal pads while being able to be moved with respect to one another between a closed position, in which the contact elements are in direct contact with one another, and an open position, in which the contact elements are separated from one another,
   a hybrid current sensor, which is according to claim 13 and which is arranged inside the casing so that one of the two terminal pads is surrounded by both the magnetic circuit of the magnetic current sensor and the Rogowski coil of the current measuring device and thus forms a primary circuit for this magnetic circuit and for this Rogowski coil, and
   a mechanism, which is arranged inside the casing and which is suitable for moving the contact elements from the closed position to the open position when a malfunction is detected by the electronic circuit of the hybrid current sensor.

\* \* \* \* \*